United States Patent
Yamazaki et al.

(10) Patent No.: US 7,465,628 B2
(45) Date of Patent: Dec. 16, 2008

(54) SEMICONDUCTOR DEVICE AND METHOD OF FABRICATING THE SAME

(75) Inventors: Soichi Yamazaki, Yokohama (JP); Koji Yamakawa, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 239 days.

(21) Appl. No.: 11/404,000

(22) Filed: Apr. 14, 2006

(65) Prior Publication Data

US 2006/0234442 A1 Oct. 19, 2006

(30) Foreign Application Priority Data

Apr. 15, 2005 (JP) ............................. 2005-119040

(51) Int. Cl.
*H01L 21/8242* (2006.01)
*H01L 21/20* (2006.01)

(52) U.S. Cl. ...................... 438/253; 438/396

(58) Field of Classification Search .............. 438/253, 438/396, 656, 686; 257/306, 313
See application file for complete search history.

(56) References Cited

U.S. PATENT DOCUMENTS 6,649,954 B2  11/2003  Cross
2007/0080382 A1*  4/2007  Kikuchi et al. ............... 257/295

FOREIGN PATENT DOCUMENTS

| JP | 11-233734 | 8/1999 |
| JP | 2000-349246 | 12/2000 |
| JP | 2003-174146 | 6/2003 |

* cited by examiner

*Primary Examiner*—Calvin Lee
(74) *Attorney, Agent, or Firm*—Finnegan, Henderson, Farabow, Garrett & Dunner, L.L.P.

(57) ABSTRACT

According to an aspect of the invention, there is provided a semiconductor device comprising a capacitor formed above a semiconductor substrate by sandwiching a dielectric film between a lower electrode and an upper electrode including an electrode film which contains an $MO_x$ type conductive oxide (M is a metal element, O is an oxygen element, and x>0), and a contact connected to the upper electrode, wherein a film thickness of the electrode film immediately below the contact is smaller than a film thickness of the electrode film in the other portion.

18 Claims, 5 Drawing Sheets

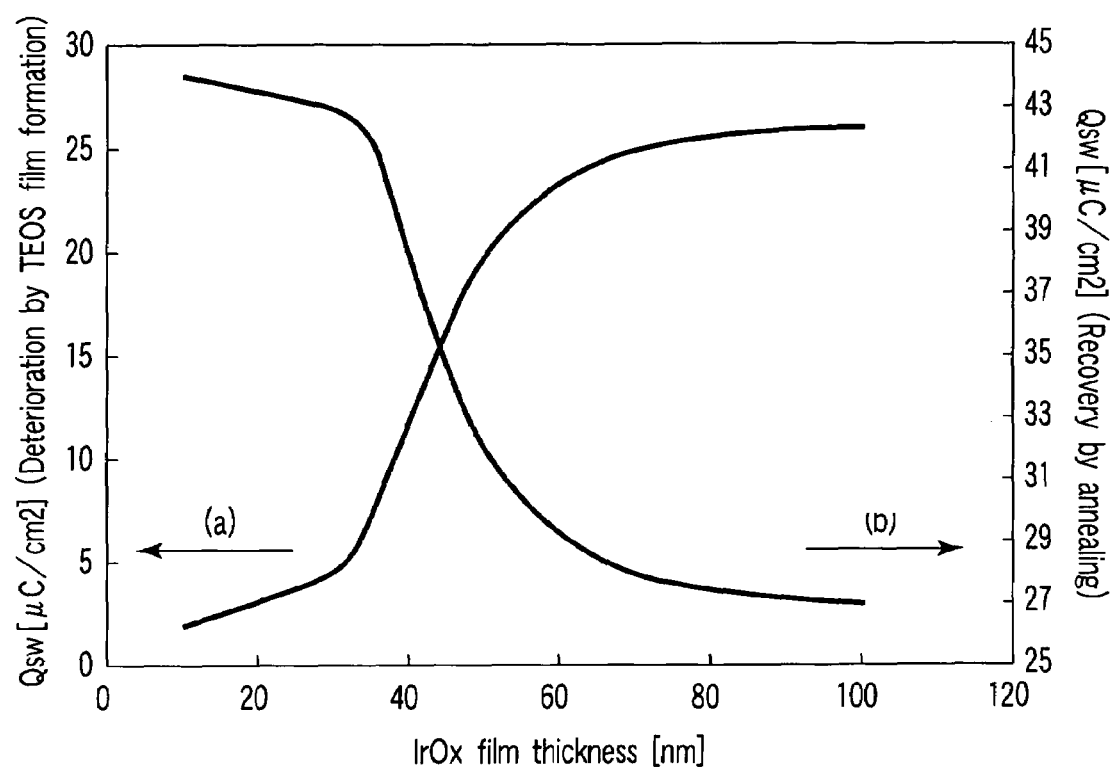
F I G. 7

US 7,465,628 B2

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2005-119040, filed Apr. 15, 2005, the entire contents of which are incorporated herein by reference.

BACKGROUND OF THE INVENTION

1. Field of the Invention

The present invention relates to a semiconductor device and a method of fabricating the same and, more particularly, to a ferroelectric film capacitor cell structure.

2. Description of the Related Art

In a capacitor cell having the conventional COP structure, a gate including a gate oxide film, gate electrode, and gate sidewall/cap SiN film is formed on a silicon (Si) substrate having an active region.

In addition, a contact hole is formed in an insulating film surrounding the gate and planarized and in a multilayer interlayer film formed on the insulating film. A poly-Si plug and W plug (and a barrier layer) are formed in this contact hole to connect the active region and a lower electrode of the capacitor via the barrier layer.

The barrier layer and capacitor lower electrode are so formed as to connect to this W plug. Furthermore, a capacitor insulating film as a ferroelectric material and a capacitor upper electrode are formed on the capacitor lower electrode.

Then, an interlayer dielectric film is formed to surround the capacitor. A contact and interconnection are so formed as to connect to the capacitor upper electrode through the interlayer dielectric film, and electrically connect TE(Top Electrode)s of adjacent capacitors (a so-called dual damascene structure).

When the interlayer dielectric film is formed to surround the capacitor, a gas mainly containing hydrogen enters the interface between the capacitor insulating film and upper electrode, and inflicts damage such as reduction or decomposition, thereby significantly deteriorating the characteristics.

In the conventional capacitor structure as described above, the influence of the damage described above increases as the degree of integration increases and the cell size reduces. This poses the problem that a signal amount required to operate the device cannot be obtained.

Note that Jpn. Pat. Appln. KOKAI Publication No. 2000-349246 discloses a structure in which an upper electrode includes an upper electrode layer, a conductive oxide layer ($SrRuO_3$) formed on the upper electrode layer and having a perovskite structure, and a metal layer (including Pt, Ir, Ru, or the like) formed on the conductive oxide layer.

Jpn. Pat. Appln. KOKAI Publication No. 11-233734 discloses a capacitor structure in which Ir is formed on a $Ta_xSi_{1-x}N_y$ or $Hf_xSi_{1-x}N_y$ diffusion barrier layer, and an $IrO_2$ film and dielectric film are stacked after annealing.

Jpn. Pat. Appln. KOKAI Publication No. 2003-174146 discloses a capacitor electrode structure in which one of a first oxide upper electrode and second oxide upper electrode in contact with the upper surface of a dielectric layer contains SRO, and the other contains $IrO_x$.

U.S. Pat. No. 6,649,954 discloses a structure in which a ferroelectric capacitor has a lower electrode, an oxide ferroelectric layer formed on the lower electrode, a first oxide upper electrode formed in contact with the upper surface of the oxide ferroelectric layer, and a second oxide upper electrode formed on the first oxide upper electrode, one of the first and second oxide upper electrodes contains SRO which contains 0.1 at % or more of an additive, and the other contains $IrO_x$.

BRIEF SUMMARY OF THE INVENTION

According to an aspect of the invention, there is provided a semiconductor device comprising: a capacitor formed above a semiconductor substrate by sandwiching a dielectric film between a lower electrode and an upper electrode including an electrode film which contains an $MO_x$ type conductive oxide (M is a metal element, O is an oxygen element, and x>0); and a contact connected to the upper electrode, wherein a film thickness of the electrode film immediately below the contact is smaller than a film thickness of the electrode film in the other portion.

According to another aspect of the invention, there is provided a semiconductor device fabrication method comprising: forming a capacitor above a semiconductor substrate by sandwiching a dielectric film between a lower electrode and an upper electrode including an electrode film which contains an $MO_x$ type conductive oxide (M is a metal element, O is an oxygen element, and x>0); depositing an interlayer dielectric film on the capacitor; forming a contact hole reaching the upper electrode through the interlayer dielectric film, such that a first film thickness of the electrode film immediately below the contact hole is smaller than a second film thickness of the electrode film in the other portion; and annealing the capacitor after the contact hole is formed.

BRIEF DESCRIPTION OF THE SEVERAL VIEWS OF THE DRAWING

FIG. 7 is a graph showing the relationship between the film thickness of $IrO_x$ of an upper electrode and the switching charge amount (Qsw) of a capacitor in a capacitor structure according to the embodiment.

DETAILED DESCRIPTION OF THE INVENTION

An embodiment of the present invention will be described below with reference to the accompanying drawing.

Figure 1:
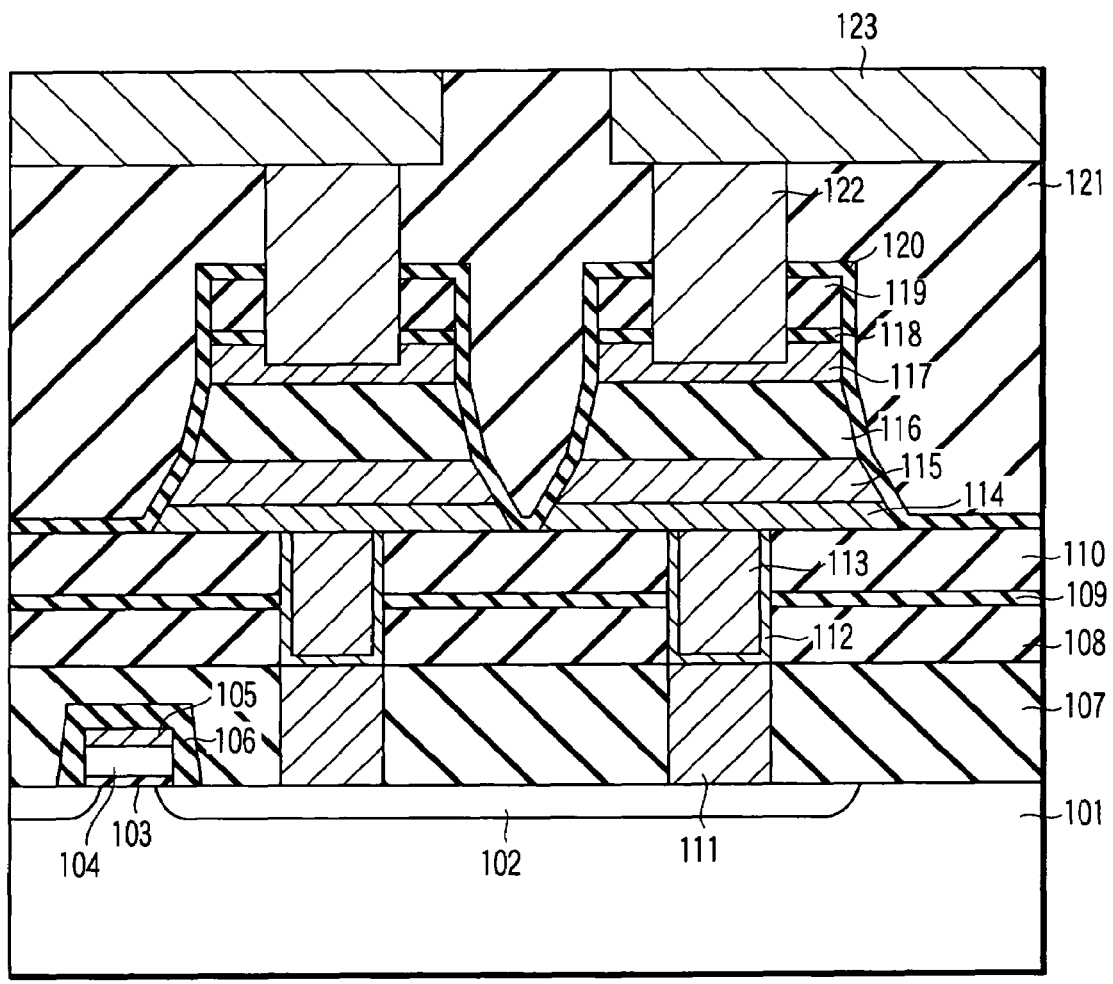
FIG. 1 is a sectional view of a memory cell of an FeRAM according to an embodiment.

FIG. 1 is a sectional view of a memory cell of an FeRAM as a semiconductor device having a stacked capacitor structure according to this embodiment. Referring to FIG. 1, a trench-shaped element isolation region (not shown) is formed on a p-type silicon (Si) substrate 101, and a MOS transistor is formed by a gate insulating film 103, a gate electrode (e.g., a polycide structure including a poly-Si film 104 and $WSi_2$ film 105) serving as a word line, a gate cap film/gate sidewall film 106 made of a silicon nitride film, and source/drain diffusion layers 102.

An interlayer dielectric film 107 (a silicon oxide film) formed to surround this transistor is planarized, and interlayer dielectric films 108 (a silicon oxide film), 109 (a silicon nitride film), and 110 (a silicon oxide film) are formed on the interlayer dielectric film 107. In the interlayer dielectric films 107, 108, 109, and 110, contact plugs 111 and W plugs 113 which connect the active region 102 of the transistor and barrier layers 114 of capacitors are formed. In addition, anti-diffusion films (contact barrier films) 112 are formed to surround the plugs 113.

Then, capacitors are formed on the interlayer dielectric film 110. Each capacitor is made up of the barrier layer (capacitor barrier film) 114, a lower electrode 115, a capacitor dielectric film 116, and an upper electrode 117. On the upper electrode 117, first and second mask films 118 and 119 for processing the upper electrode remain after capacitor processing.

Furthermore, a reducing ambient anti-diffusion film 120 is formed to surround the whole of each capacitor. A contact 122 and interconnection 123 for connecting the upper electrodes of adjacent capacitors are formed in an interlayer dielectric film (silicon oxide film) 121 formed on the reducing ambient anti-diffusion film 120.

FIGS. 2 to 5 are sectional views showing the fabrication steps, i.e., the steps after so-called pre-steps, of the semiconductor device according to this embodiment. FIG. 6 is a flowchart showing the fabrication steps of this semiconductor device. A method of fabricating the capacitor structure according to this embodiment will be explained below with reference to FIGS. 2 to 6.

Figure 2:
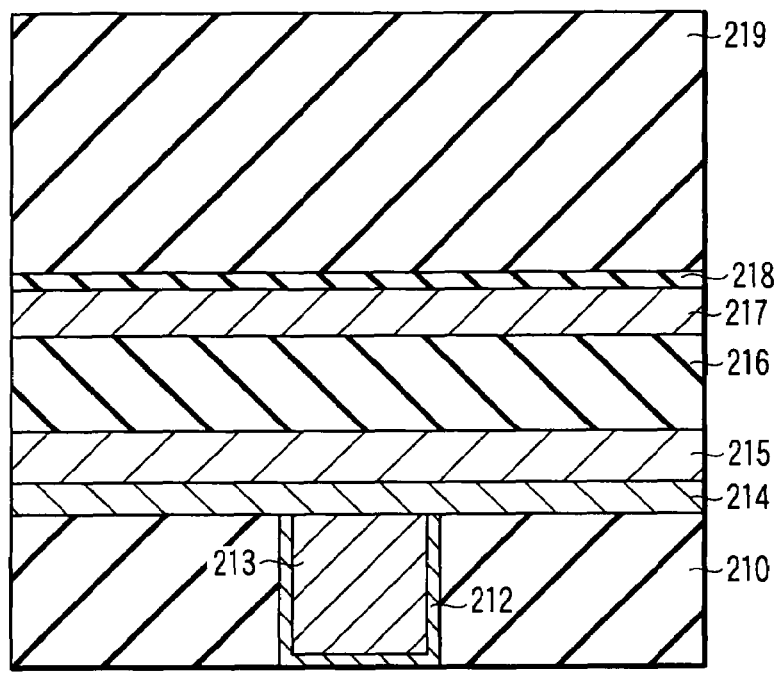
FIG. 2 is a sectional view showing a fabrication step of the semiconductor device according to the embodiment.

First, as shown in FIG. 2, a contact hole is formed in an interlayer dielectric film (not shown) so as to connect a polysilicon plug (not shown) to a source/drain diffusion layer (not shown). A barrier layer such as a Ti/TiN film or Ti film 212 is deposited in this contact hole by sputtering or CVD, and annealing is performed in a forming gas. Subsequently, a W film is deposited on the entire surface by CVD, and removed from a region except for the contact hole by CMP, thereby forming a contact plug 213.

After that, a barrier layer 214 is formed by depositing a TaSiN film, a TiAlN film, or a stacked film of these films on the entire surface by sputtering. Then, a capacitor lower electrode film 215 is formed by depositing a stacked film of, e.g., Ir, $IrO_2$, Pt, Ti, or SRO by sputtering. In addition, a capacitor dielectric film 216 is formed by depositing a ferroelectric film such as a $Pb(Zr,Ti)O_3$ (PZT) film by sputtering or CVD (step S1). It is also possible to use SBT ($SrBi_2Ta_2O_9$) or BIT ($Bi_4Ti_3O_{12}$) as the capacitor dielectric film 216.

After an SRO film (first upper electrode) is deposited by using sputtering, annealing such as RTA is performed to crystallize the SRO film. Furthermore, an $IrO_x$ (an $MO_x$ type conductive oxide (M is a metal element, O is an oxygen element, x>0, and x is an arbitrary number)) film (a second upper electrode, an electrode film) is deposited by sputtering, thereby forming a capacitor upper electrode 217 made of the SRO/$IrO_x$ stacked layer. The film thickness of the $IrO_x$ film is constantly 50 to 100 nm on the entire surface. The $IrO_x$ film reduces itself and functions as a buffer layer (reduction sacrificial layer) in a reducing ambient such as hydrogen, and shows high barrier properties against oxygen at the same time. Other merits of the SRO/$IrO_x$ stacked upper electrode are to strengthen the reducing gas barrier properties, and prevent diffusion of Ir, which is produced by reduction of $IrO_x$, into the PZT film, thereby improving the reliability of the semiconductor device.

After that, an $Al_2O_3$ film or the like is deposited as a first mask-film 218 by sputtering or CVD (step S2), and an $SiO_2$ film such as TEOS is subsequently deposited as a second mask film 219 (step S3). In the latter step, the reducing damage when the second mask film 219 is deposited can be alleviated by allowing the 50- to 100-nm thick $IrO_x$ film to function as a barrier layer against a reducing ambient.

Figure 3:
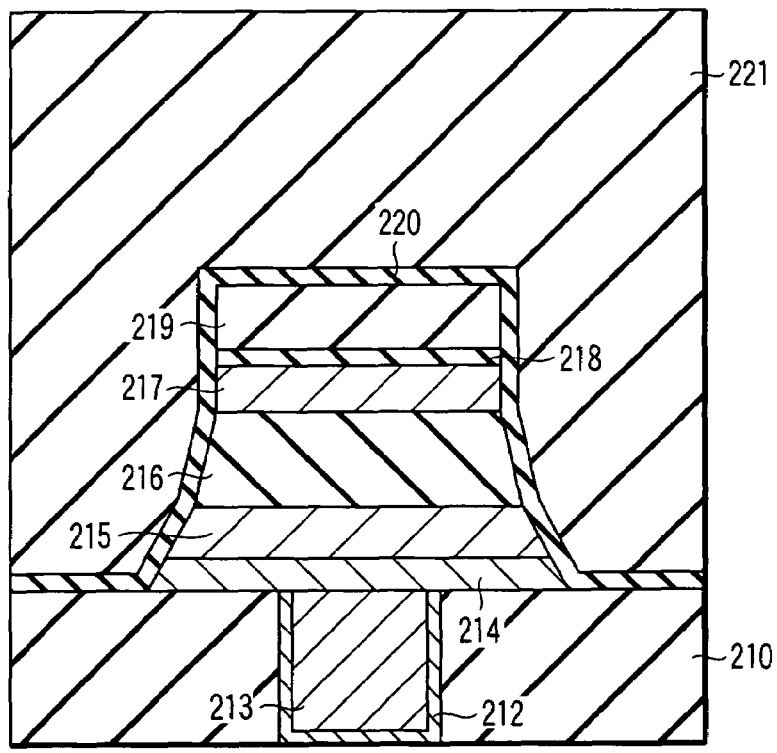
FIG. 3 is a sectional view showing a fabrication step of the semiconductor device according to the embodiment.

As shown in FIG. 3, the second mask 219 is processed by photolithography (step S4) and RIE (step S5), and the resist is removed by ashing (step S6). Subsequently, the first mask film 218, capacitor upper electrode 217, capacitor dielectric film 216, capacitor lower electrode 215, and barrier layer 214 are processed by RIE. After that, a reducing ambient anti-diffusion film ($Al_2O_3$ film) 220 and interlayer dielectric film (TEOS, an $SiO_2$ film) 221 are deposited on the entire surface by sputtering or CVD (steps S7 and S8), and planarized by CMP.

Figure 4:
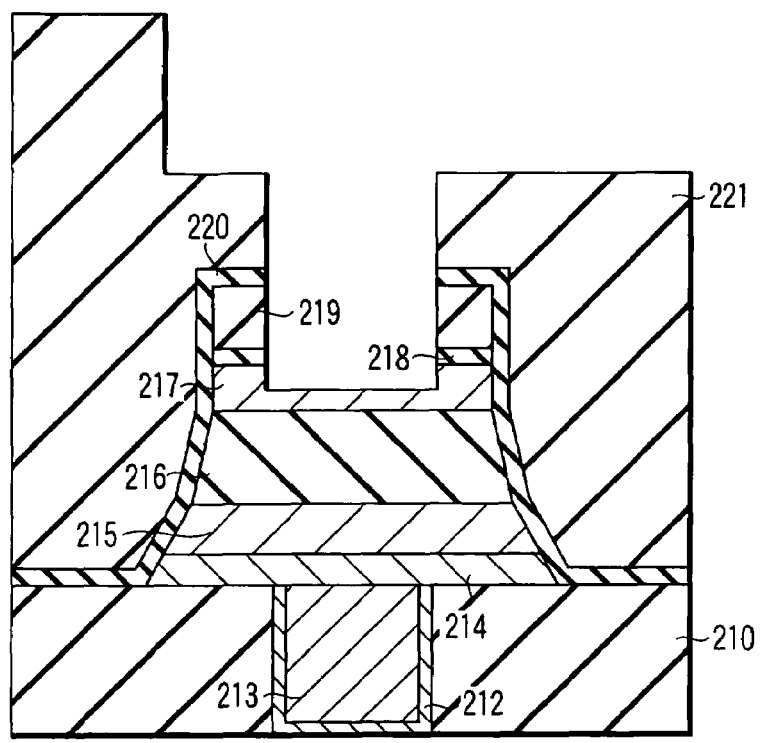
FIG. 4 is a sectional view showing a fabrication step of the semiconductor device according to the embodiment.

As shown in FIG. 4, the interlayer dielectric film 221, reducing ambient anti-diffusion film 220, second mask film 219, and first mask film 218 are etched by photolithography (step S9) and RIE (step S10), thereby forming a contact hole reaching the capacitor upper electrode 217. Etching is further advanced under gas conditions which do not damage the capacitor, thereby controlling the film thickness of the $IrO_x$ film of the upper electrode 217 immediately below the contact hole to 10 to 50 nm, desirably, 15 to 35 nm (step S11). Since the $IrO_x$ film also functions as an oxygen barrier layer, it is possible, by controlling the film thickness to 10 to 50 nm, desirably, 15 to 35 nm, to increase the effect of recovery annealing which supplies oxygen from the contact hole, thereby improving the reliability of the semiconductor device. Subsequently, photolithography and RIE are used to form a trench for an interconnection. After that, annealing is performed to recover the damage to the capacitor (step S12). This annealing is typically performed in oxygen at 600° C. for 30 to 60 min. Note that the damage described above is caused by hydrogen in the CVD step of forming the hard mask and interlayer dielectric film on the capacitor, the reducing ambient gas in the capacitor RIE processing step, or hydrogen which forms when the water and metal existing in the insulating film react with each other in the annealing step. This damage forms defects including spatial electric charge such as oxygen deficiency and hydrogen bonding in the interface between the capacitor insulating film and electrode and in the capacitor insulating film, thereby interfering with polarization reversal.

As described above, the damage occurring when the contact hole connecting to the upper electrode is formed is efficiently reduced by the 50- to 100-nm thick $IrO_x$ film, and the film thickness of this $IrO_x$ film having oxygen barrier properties is then decreased to 15 to 35 nm. In this manner, the capacitor can be efficiently recovered by annealing in an oxygen ambient.

Figure 5:
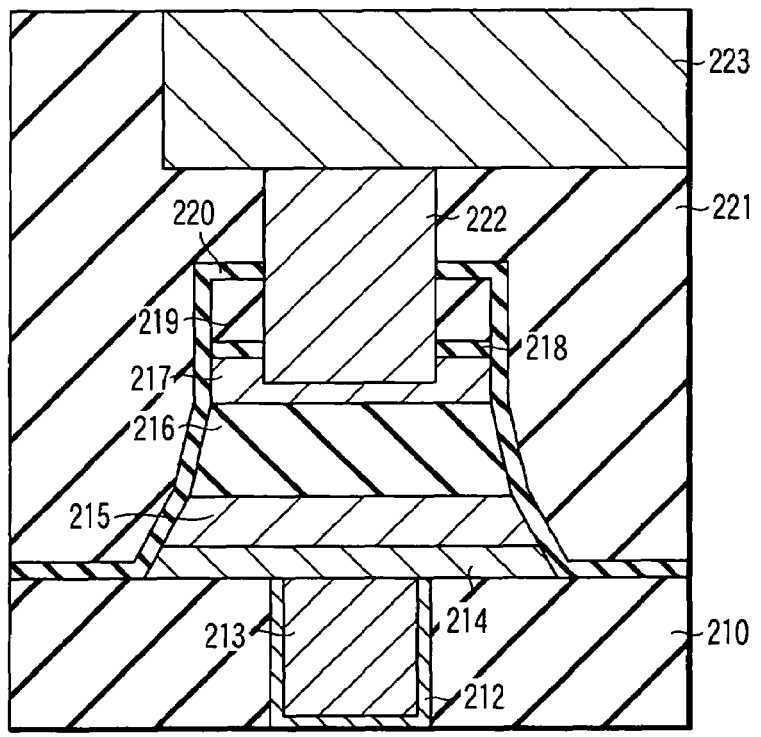
FIG. 5 is a sectional view showing a fabrication step of the semiconductor device according to the embodiment.
Figure 6:
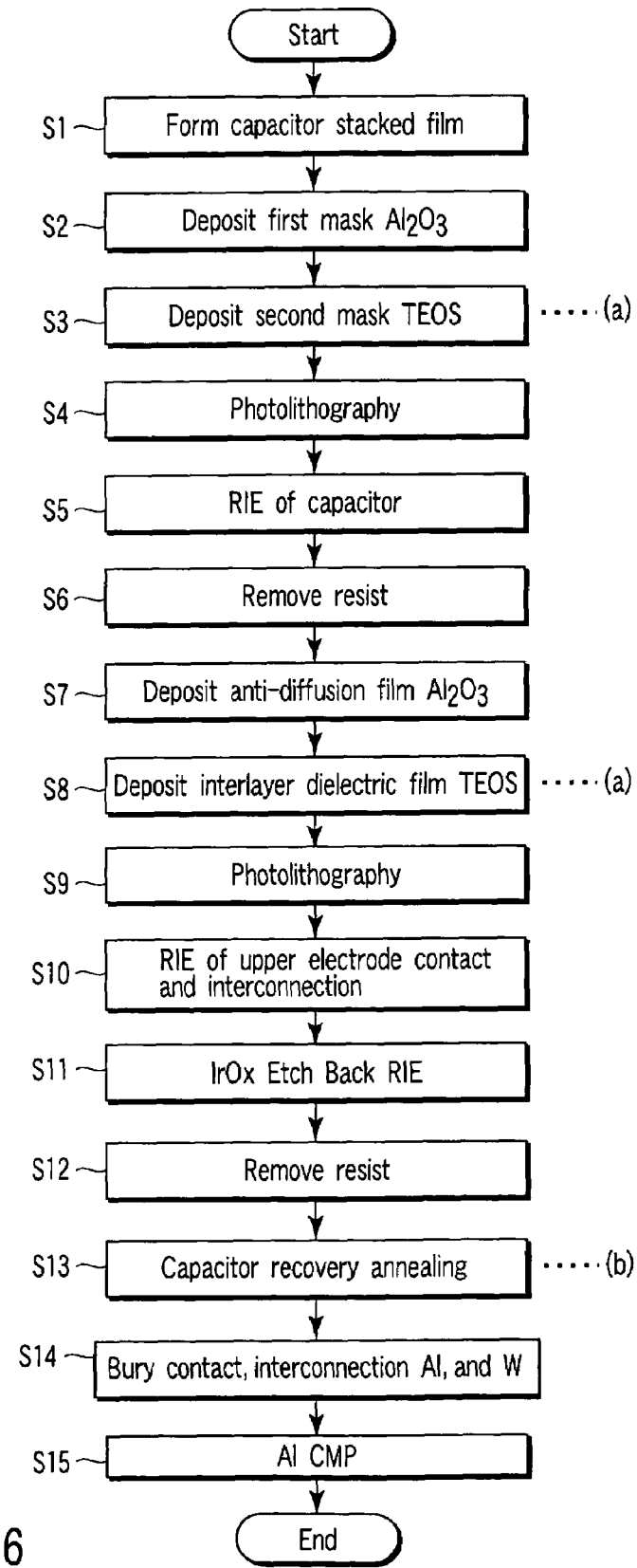
FIG. 6 is a flowchart showing the fabrication steps of the semiconductor device according to the embodiment.

After that, as shown in FIG. 5, a barrier film (not shown), Al film or W film, Al—Cu alloy film, and the like are buried in the formed contact hole and interconnecting trench by sputtering or CVD, and interconnection processing is performed by CMP, thereby forming a contact 222 and interconnection 223 (steps S13 and S14).

As described above, the upper electrode is made of the SRO/IrO$_x$ stacked film, and the film thickness of the IrO$_x$ film is controlled during the semiconductor device fabrication process. This makes it possible to reduce the damage to the interface between the capacitor dielectric film and upper electrode, and efficiently recover the capacitor, thereby improving the reliability of the semiconductor device.

Note that in the second upper electrode of the stacked structure of the capacitor upper electrode 217, the following materials can be used as the MO$_x$ type conductive oxide (M is a metal element, O is an oxygen element, x>0, and x is an arbitrary number). This MO$_x$ type conductive oxide includes PtO$_x$, IrO$_x$, RuO$_x$, RhO$_x$, and OsO$_x$ as noble metal oxides, solid solutions and mixtures of these noble metal oxides, and a material which mainly contains these noble metal oxides and to which another element is added in the form of a dopant. Examples other than the noble metal oxides are conductive oxides such as ReO$_3$, VO$_x$, TiO$_x$, InO$_x$, SnO$_x$, ZnO$_x$, and NiO$_x$. Any of these conductive oxides may also be used as the MO$_x$ type conductive oxide.

FIG. 7 is a graph showing the relationship between the film thickness of IrO$_x$ of the upper electrode in the capacitor structure described above and the switching charge amount (an electric charge amount Qsw upon polarization reversal) of the capacitor. The data in FIG. 7 shows deterioration of the capacitor by the damage when TEOS as the hard mask is deposited during capacitor processing (step S3 in FIG. 6) or TEOS of the interlayer dielectric film is deposited (step S8 in FIG. 6), and recovery of the characteristics by annealing after that (step S12 in FIG. 6).

Referring to FIG. 7, no optimum IrO$_x$ film thickness apparently exists. However, by performing the IrO$_x$ etch back RIE process (overetching of the electrode) in step S11 of FIG. 6, it is possible to control the film thickness of IrO$_x$ forming the upper electrode to about 35 nm, efficiently increase the effect of recovery annealing in step S12, and obtain a signal amount necessary for a device operation.

Although the IrO$_x$ film thickness to be controlled is explained by taking an example in this embodiment, this film thickness is determined by the hydrogen and oxygen barrier properties of IrO$_x$. As data in this case, the curves shown in FIG. 7 shift by a certain width in the axial direction indicating the IrO$_x$ film thickness.

The above method is also applicable to RuO$_2$ forming an upper electrode of a DRAM having a stacked capacitor structure using a high-k material.

As described earlier, with the increasing integration degree of an FeRAM using a ferroelectric film represented by Pb(Zr, Ti)O$_3$ or of an embedded memory using a ferroelectric capacitor having a ferroelectric material as an insulating film, it is necessary to reduce the area occupied by the capacitor in the chip while ensuring a signal amount required to operate the device without any problem.

In this embodiment, in the capacitor structure of an FeRAM or embedded memory, the SRO/IrO$_x$ stacked film is used as the capacitor upper electrode, and the IrO$_x$ film thickness is controlled. Accordingly, a sufficient capacitor signal amount can be obtained even when the area occupied by the capacitor is small.

This embodiment can provide a semiconductor device and a method of fabricating the same which efficiently recover damage inflicted on the interface of a capacitor insulating film or upper electrode in a structure in which a capacitor is formed. That is, it is possible to reduce deterioration of the capacitor characteristics caused by back end damage in the semiconductor device fabrication process, and efficiently recover the capacitor from the damage, thereby improving the reliability of the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a capacitor formed above a semiconductor substrate by sandwiching a dielectric film between a lower electrode and an upper electrode including an electrode film which contains an MO$_x$ type conductive oxide (M is a metal element, O is an oxygen element, and x>0); and
a contact connected to the upper electrode,
wherein a film thickness of the electrode film immediately below the contact is smaller than a film thickness of the electrode film in the other portion.

2. The device according to claim 1, wherein the film thickness of the electrode film is 10 to 50 nm immediately below the contact, and 50 to 100 nm in the other portion.

3. The device according to claim 1, wherein the MO$_x$ type conductive oxide comprises IrO$_x$.

4. The device according to claim 1, wherein the upper electrode comprises a first upper electrode and a second upper electrode as the electrode film.

5. The device according to claim 4, wherein the first upper electrode contains SRO.

6. The device according to claim 4, wherein the MO$_x$ type conductive oxide comprises IrO$_x$.

7. The device according to claim 1, wherein the dielectric film is made of a material selected from the group consisting of PZT, SBT, and BIT.

8. The device according to claim 1, wherein the MO$_x$ type conductive oxide contains a material selected from the group consisting of PtO$_x$, IrO$_x$, RuO$_x$, RhO$_x$, and OsO$_x$.

9. The device according to claim 1, wherein the MO$_x$ type conductive oxide contains a material selected from the group consisting of ReO$_3$, VO$_x$, TiO$_x$, InO$_x$, SnO$_x$, ZnO$_x$, and NiO$_x$.

10. A semiconductor device fabrication method comprising:

forming a capacitor above a semiconductor substrate by sandwiching a dielectric film between a lower electrode and an upper electrode including an electrode film which contains an MO$_x$ type conductive oxide (M is a metal element, O is an oxygen element, and x>0);

depositing an interlayer dielectric film on the capacitor;
forming a contact hole reaching the upper electrode through the interlayer dielectric film, such that a first film thickness of the electrode film immediately below the contact hole is smaller than a second film thickness of the electrode film in the other portion; and
annealing the capacitor after the contact hole is formed.

11. The method according to claim 10, wherein the first film thickness is 10 to 50 nm, and the second film thickness is 50 to 100 nm.

12. The method according to claim 10, wherein the MO$_x$ type conductive oxide comprises IrO$_x$.

13. The method according to claim 10, wherein the upper electrode comprises a first upper electrode and a second upper electrode as the electrode film.

14. The method according to claim 13, wherein the first upper electrode contains SRO.

15. The method according to claim 13, wherein the $MO_x$ type conductive oxide comprises $IrO_x$.

16. The method according to claim 10, wherein the dielectric film is made of a material selected from the group consisting of PZT, SBT, and BIT.

17. The method according to claim 10, wherein the $MO_x$ type conductive oxide contains a material selected from the group consisting of $PtO_x$, $IrO_x$, $RuO_x$, $RhO_x$, and $OsO_x$.

18. The method according to claim 10, wherein the $MO_x$ type conductive oxide contains a material selected from the group consisting of $ReO_3$, $VO_x$, $TiO_x$, $InO_x$, $SnO_x$, $ZnO_x$, and $NiO_x$.

* * * * *